United States Patent [19]

Fischer

[11] Patent Number: 5,422,139
[45] Date of Patent: Jun. 6, 1995

[54] METHOD FOR A REACTIVE SURFACE TREATMENT OF A WORKPIECE AND A TREATMENT CHAMBER FOR PRACTICING SUCH METHOD

[75] Inventor: Heinrich Fischer, Furstentum, Liechtenstein

[73] Assignee: Balzers Aktiengesellschaft, Furstentum, Liechtenstein

[21] Appl. No.: 67,392

[22] Filed: May 25, 1993

Related U.S. Application Data

[63] Continuation of Ser. No. 682,630, Apr. 9, 1991, abandoned.

[30] Foreign Application Priority Data

Apr. 12, 1990 [DE] Germany ............. 40 11 933.5

[51] Int. Cl.6 .................................. C23C 16/00
[52] U.S. Cl. ................... 427/248.1; 427/569; 156/345; 118/715; 216/58; 216/67
[58] Field of Search .............. 427/569, 248.1; 156/345, 643, 646; 118/715

[56] References Cited

U.S. PATENT DOCUMENTS

| | | | |
|---|---|---|---|
| 4,209,357 | 6/1980 | Gorin et al. | 156/643 |
| 4,590,042 | 5/1986 | Drage | 156/345 |
| 4,780,169 | 10/1988 | Stark et al. | 156/345 |
| 4,820,371 | 4/1989 | Rose | 118/728 |
| 4,870,923 | 10/1989 | Sugimoto | 118/715 |

FOREIGN PATENT DOCUMENTS

| | | |
|---|---|---|
| 0019370 | 11/1980 | European Pat. Off. |
| 0254654 | 7/1987 | European Pat. Off. |
| 0283007 | 3/1988 | European Pat. Off. |
| 0303508 | 8/1988 | European Pat. Off. |
| 3020815 | 6/1980 | Germany |
| 56-10932 | 4/1981 | Japan |
| 1-162772 | 9/1989 | Japan |

*Primary Examiner*—Shrive Beck
*Assistant Examiner*—David M. Maiorana
*Attorney, Agent, or Firm*—Louis Weinstein

[57] ABSTRACT

A method for a reactive surface treatment of a workpiece, according to which a treatment gas is let out of at least one infeed opening into a treatment chamber and is drawn off said treatment chamber through at least one draw off opening, which openings are arranged adjacent of each other over and across the area to the surface to be treated and feature axes of the openings which extend at least approximately perpendicularly to the surface to be treated. The treatment chamber further includes a support for positioning of the workpiece in such a manner that at least one infeed opening which is connected to a gas delivery device for a treatment gas and at least one draw off opening which is connected to a gas draw off device are located opposite the surface of the positioned workpiece.

14 Claims, 4 Drawing Sheets

METHOD FOR A REACTIVE SURFACE TREATMENT OF A WORKPIECE AND A TREATMENT CHAMBER FOR PRACTICING SUCH METHOD

This is a continuation of application Ser. No. 07/682,630 filed Apr. 9, 1991, now abandoned.

BACKGROUND OF THE INVENTION

1. Field of the Invention

The present invention relates to a method for a reactive surface treatment of a workpiece, according to which a treatment gas is led out of at least one infeed opening into a treatment chamber, is drawn off from said treatment chamber through at least one draw off opening, which openings are arranged adjacent of each other over and across the area of the surface to be treated and feature axes of the openings which extend at least approximately perpendicularly to the surface to be treated.

The invention relates further to a treatment chamber for a reactive surface treatment of a workpiece, including a support for a positioning of the surface of the workpiece to be treated in the chamber, and oppositely of the positioned surface at least one infeed opening for a treatment gas connected to a gas delivery device, at least one gas draw off opening for gas connected to a gas draw off device in which at least one gas draw off opening is located directly adjacent the infeed openings and whereby the axes of the opening(s) extend at least approximately perpendicularly to the area of the surface located oppositely of the openings.

The present invention relates basically to the forming of the gas flow at reactive surface treatment processes, i.e. the delivering or feeding, respectively of a treatment gas having gas components which react chemically during the surface treatment and the drawing off of gas from the treatment chamber as well, which gas includes the reaction products of the above mentioned reaction.

2. Description of the Prior Art

The French specification FR-A-26 23 524 discloses a CVD-coating method according to which the treatment gas is fed into the chamber laterally at the side of the surface to be treated and the gas including the product of the reaction is led off through a plurality of draw off openings located oppositely of the surface.

The European specification EP-A-O 283 007 discloses a CVD-coating method according to which the treatment gas is fed into the chamber from a plurality of openings located opposite of the surface to be coated and the gas including the products of the reaction is drawn off laterally at the side of the surface to be treated.

The European specification EP-A-O 322 466 discloses a plasma supported (PE-) CVD-method according to which the treatment gas is led in from a plurality of openings located oppositely of the surface to be treated and the products of the reaction are led off through a draw off opening which is located relative to the workpiece substantially opposite of the inlet openings such that the gas flow proceeds radially around the periphery of the workpiece towards the draw off opening.

The European specification EP-A-O 303 508 discloses in turn a PECVD-method according to which the treatment gas, whereby the work piece is arranged in its treatment position, is fed out of a plurality of openings located opposite of the surface to be treated, and whereby gas with the products of the reaction is drawn off laterally at the side of the surface to be treated.

In the framework of CVD-methods conducted under atmospheric and vacuum conditions as well, the U.S. Pat. No. 4,817,558 patent document discloses a feeding of treatment gas from openings located opposite of the surface to be treated and again to draw off the products of the reaction laterally or peripherically, resp. of the surface to be treated.

At the other hand, the European specification EP-A-0 254 654 discloses to lead the gas flow substantially over and across the entire surface to be treated, i.e. to feed the treatment gas at the one side of the surface to be treated thereagainst and to draw it again off at the other side.

Finally, the U.S. Pat. No. 4,297,162 patent document discloses to feed the treatment gas used in an RF-plasma-etching method from a plurality of openings to the surface to be treated located opposite of the surface, whereby the openings are located at different distances relative to the surface to be treated such to arrive at a desired etching profile at the surface of the workpiece. The gas and accordingly the products of the reaction of the reactive etching process are drawn out of the chamber by a vacuum pump connected to the chamber. The draw off conduit is located relative to the workpiece to be treated at the side opposite the infeed openings, such that the gas flow proceeds radially around the periphery of the workpiece to the draw off opening located centrally below the workpiece.

In reactive surface treatment processes in which at least a portion of the treatment gas reacts chemically, the relationship between the concentration of reaction gas which has not yet been consumed and the gaseous reaction products in the direct vicinity of the surface to be treated is to be given careful attention regarding the effect of the treatment, i.e. rate of coating or etching, resp. the term "rate" is here to be understood as: amount per unit of time.

If a flow of freshly fed reactive treatment gas wafts over the surface and reacts the above-mentioned relationship is continuously changed in the flow to the disadvantage of the fresh reactive gas such that also the effect of the treatment changes along the surface over which the gas wafts. The above-mentioned known procedures do not take this phenomenon into account. This phenomenon occurs always when a gas flow wafts over a large area substantially continuously over the surface to be treated. This, accordingly in such a case if treatment gas is fed from a plurality of gas inlets to the surface to be treated and relative thereto gas with reaction products is peripherically drawn off: In such case an extensive gas flow is produced which is directed radially or from the centre to the periphery.

Now, the U.S. Pat. No. 4,209,357 discloses to foresee in the framework of a plasma etching method a plurality of infeed openings for the treatment gas and a plurality of draw off openings as well opposite of the surface of the workpiece which openings allow together a uniform feeding of treatment gas and drawing off of gas in the reaction chamber.

The German specification DE-OS-30 20 815 discloses a plasma supported reactive coating process in which the treatment gas is fed from a supply chamber through openings in one of the glow discharge electrodes into the treatment chamber proper between the electrodes and to lead the reaction products through the same openings out of the treatment chamber into the same supply chamber whereby the flow of the treatment gas to and into the treatment chamber and of the reaction products from and out of the treatment chamber back into the supply chamber proceeds based on a gas diffusion.

In this procedure the distribution of the treatment gas and of the reaction products can hardly be controlled in the treatment chamber. Thus, it is not guaranteed that fresh reaction gas is present at the area of the workpiece to be coated in a predominant measure because such depends decisively at the one hand from the distribution of the reaction in the treatment chamber and of the speeds of the diffusion of the fresh treatment gas as well, and at the other hand from the reaction products.

SUMMARY OF THE INVENTION

It is, therefore, a general object of the invention to provide a method and a treatment chamber by means of which a) the effect of the treatment can be selectively influenced in an area of the surface of the workpiece to be treated, b) the fed reactive gas is better utilized for the surface treatment.

The method shall lend itself to be specifically workable at a CVD- or a reactive PVD-method.

A further object is to provide a method wherein the distance between the openings, the distance between the openings and the area of the surface to be treated, the gas infeed and the drawing off of the gas infeed and/or the drawing off of the gas causes a selective change of the effect of the treatment at said area.

Still a further object is to provide a treatment chamber in which the support for the workpiece is selected relative to the openings and the settings of the gas delivery device and of the gas draw off device are selected in such a manner that a change of at least one of these settings causes a selective change of the effect of the treatment at the area of the surface under treatment.

The present invention proceeds basically from the recognition that if in contrast to the above-mentioned techniques no large area gas flow across the surface to be treated is generated, but rather selective surface area portions are formed where gas flows to the surface to be treated, is there turned around and flows back at the side of same, the problem that fresh reaction gas consumes itself increasingly along the growing extent of the magnitude of the path of flow along the surface to be treated and accordingly varying treatment conditions occur along the surface is solved and that accordingly the possibility of influencing the effect of the treatment selectively at areas of the surface is now given.

Furthermore, because no "seas" of not reacting or little reacting fresh reaction gas are formed, the fresh reaction gas fed to the process or into the chamber, respectively is utilized to a much higher extent regarding the effectiveness of the treatment.

In contrast to the hiterto known techniques the surface to be treated is thus in accordance with the invention located so close regarding infeed and draw off openings that in the surface area located directly under these openings there still is a gas flow present which is determined by the inflow or draw off, respectively flow conditions which are set or are present at these openings. This is recognizable in that then when the gas infeed and the thereto allocated gas outlet are changed such as by a change of the jetting out impulse at the infeed and/or the design of the inlet or the drawn off mass flow, respectively or the design of the draw off opening are changed, a change of the effect of the treatment is produced in the surface area which is located directly under the above-mentioned two openings, may such be the rate of the coating or sputtering, respectively, whereby, however, this change has substantially no effect in the adjacent surface areas. It is, thereby, quite obviously to take into account that the accordingly changing effect of the treatment disappears only in a constant fashion in the adjacent areas.

Accordingly, it also is an object of the invention to provide a method to selectively obtain an influence at a surface area of a workpiece located under a single infeed opening and a single draw off opening.

Yet a further object is to provide a method wherein at least one infeed opening and a plurality of draw off openings adjacent the at least one infeed opening are provided and the drawing off of the gas is made to act at the plurality of draw off openings such that the area whereat the change takes place selectively is the area of the surface which is located opposite of the at least one infeed opening and the plurality of draw off openings.

In case of the above-mentioned most simple design of only a single respective opening a U-shaped flow from the inflow opening to the adjacent draw off opening can be said to be produced, such that the selectively influenceable surface area is located in an area of the treatment chamber in which the mentioned flow is present. The mentioned further object directed to at least one infeed and a plurality of draw off openings leads to a flow shape of a spatial plane which corresponds to a U-shape which rotates around one leg. By means of such the selectively influenced area of the surface to be treated is larger.

Still a further object is to provide a method wherein at least one draw off opening and a plurality of gas infeed openings adjacent the at least one single draw off opening are forseen and the gas infeed is made to act at the plurality of gas infeed openings such that the area whereat the change takes place selectively is the area of the surface which is located opposite of the at least one draw off opening and the plurality of infeed openings. Such causes again a spatial flow as set forth above but with a reversed direction of flow.

A further object is to provide a method wherein a plurality of infeed and/or draw off openings is forseen and the distribution of the effect of the treatment is set by a selection of the respective values of the distances and the respective gas infeed and drawing off of the gas, respectively. Such allows an application of the method over substantially the entire surface to be treated.

Still a further object is to provide methods as set forth above for surface treatment processes at atmospheric pressure and also at vacuum conditions.

Yet a further object is to provide methods as set forth above for CVD-processes, specifically pyrolitic CVD-processes. The reason for pyrolitic CVD-processes is because the distribution of the effect of the treatment, without a plasma support, depends in the largest extent from mentioned gas flows, where in case of plasma supported CVD-methods parameters of the plasma discharge can decisively influence this distribution. Quite obviously it is, however, also possible to obtain by a proceeding in accordance with the invention also here a selected design-distribution and to act against undesired influences caused by the discharges.

A further object is to provide methods as set forth above for processes encompassing electrical DC or AC discharges, the latter possibly with a DC-biassing of the workpiece in accordance with known techniques. The discharge is supplied also in accordance with known techniques by AC in the HF-range or microwave range.

Yet a further object is to provide methods as set forth above for reactive PVD-processes in which physical (ionization) or chemical gas reactions take place.

More generally it is an object to provide methods as set forth above for processes in which gas is consumed or "used up", respectively due to a reaction, specifically in the area of surfaces to be treated.

A further object of the invention is to provide a treatment chamber for a reactive surface treatment of a workpiece, in which a support for the workpiece is selected relative to the openings and the settings of the gas delivery device and the gas draw off device are selected in such a manner that a change of at least one of these settings causes a selective change of the effect of the treatment at the area of the surface being treated.

Still a further object is to provide a treatment chamber which has at least one infeed opening and a plurality of draw off openings located directly adjacent thereto, which draw off openings are connected to gas draw off devices having substantially the same effects among themselves.

Yet a further object is to provide a treatment chamber having at least one draw off opening and a plurality of infeed openings located directly adjacent thereto, which infeed openings are connected to gas delivery devices having substantially the same effects among themselves.

A further object is to provide a treatment chamber having a plurality of infeed openings and/or draw off openings which infeed openings and/or draw off openings provided are respectively differently designed and/or are connected to respective different delivery devices and draw off devices respectively for a purposeful and aimed influencing of the distribution of the effect of the treatment onto the surface to be treated.

BRIEF DESCRIPTION OF THE DRAWINGS

The invention will be better understood and objects other than those set forth above will become apparent when consideration is given to the following detailed description thereof. Such description makes reference to the annexed drawings wherein.

DETAILED DESCRIPTION OF THE PREFERRED EMBODIMENTS

Figure 1:
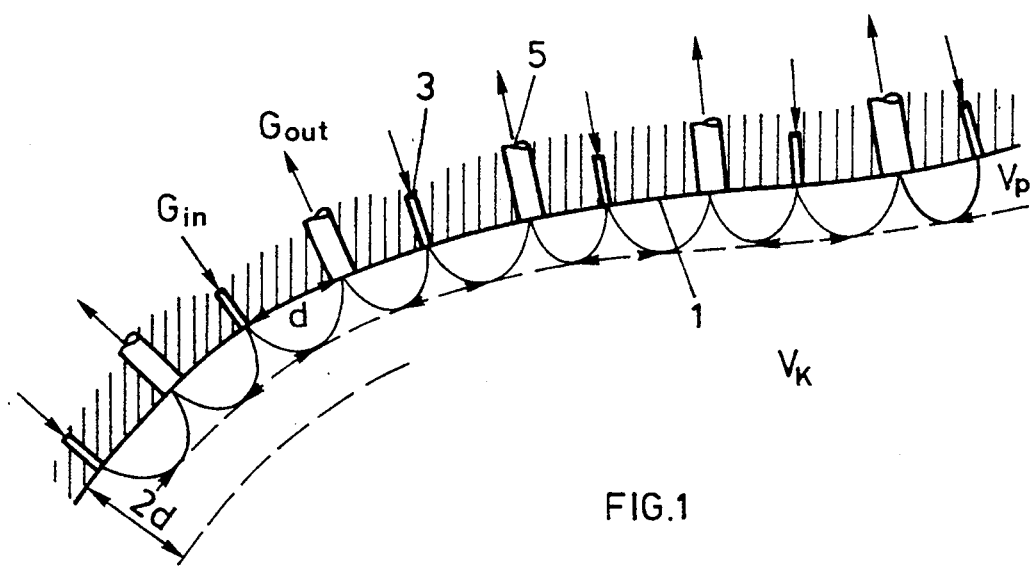
FIG. 1 illustrates schematically a spatial plane of a treatment chamber (not illustrated) having infeed openings for a treatment gas and draw off openings for gaseous reaction products for an explanation of the basis of the procedure of the present invention being followed.

The procedure in accordance with the invention in a here not illustrated treatment chamber is illustrated in FIG. 1 schematically and in principle.

At a boundary surface 1 of a chamber reaction volume $V_K$ an array of infeed openings 3 for treatment gas $G_{in}$ is provided, through which the treatment gas needed for the reactive treatment process enters. Furthermore, draw off openings 5 are provided, at which gas with reaction products is drawn off from volume $V_K$. The infeed openings 3 and draw off openings 5 are located directly adjacent each other. The main directions of flow of adjacent infeed and draw off, respectively openings 3, 5 extend substantially parallel to each other.

Regarding the statement "directly adjacent": If from one given opening 3 or 5 of one of the kinds (e.g. infeed opening) circles or possibly planes of spheres which are concentric relative to such opening the distance is increased, the one or several openings which are met firstly will be of the other kind, i.e. 5 or 3 (e.g. draw off openings).

The chamber or process, respectively volume $V_K$ is utilized in accordance with the invention only in the close vicinity of the infeed/draw off opening pairs for the arranging of the surface which is to be treated in accordance with the invention.

The volume portion $V_p$ which is utilized in accordance with the invention is indicated in FIG. 1 with broken lines relative to the surface 1. U-shaped flows are produced between pairs of infeed and draw off openings which flows are illustrated on a qualitative basis only. The distance by which the U-shaped gas flow field of adjacent openings 3, 5 extends into the process space depends mainly from:

the conditions of the gas infeed, i.e. lastly from the impulse of the gas which is jetted in, the pressure conditions in the chamber, the conditions of the gas draw off, i.e. the draw off volume or mass flow.

As a general rule in vacuum processes changes of this value can be registered up to about twice the distance 2 d between the openings.

Figure 1A:
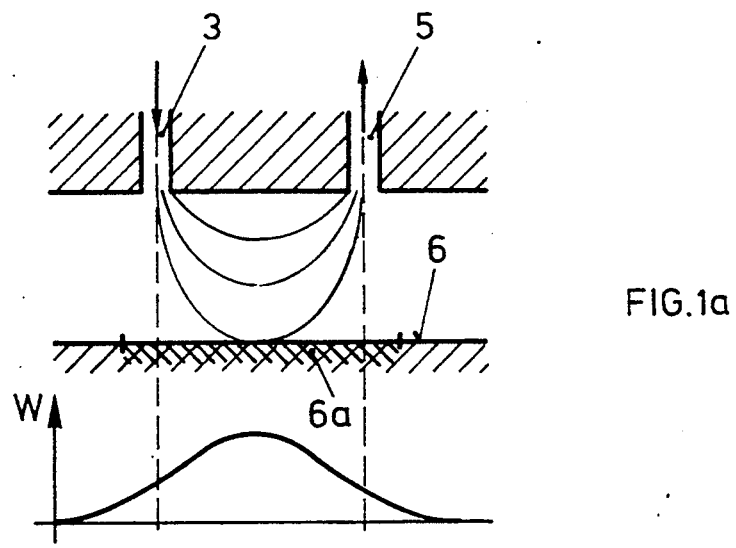
FIG. 1a is an enlarged cut-out of the arrangement of FIG. 1 for the explanation of the inventive influencing of the effect.

In FIG. 1a an infeed opening 3 and a draw off opening 5 and the gas flow prevailing therebetween are illustrated relative to a surface 6 to be treated in a qualitative manner. If the conditions of the infeed and/or of the drawing off are changed in that for instance the impulse of the gas emitted at the opening 3 is increased and/or such of the drawn off volume or mass flow at the draw off line 5 there follows if the area 6a of the surface 6 to be treated which is opposite of the two openings 3 and 5 is located following the present invention at a distance from the two openings 3, 5 a change of the effect of the treatment w such as illustrated on a qualitative basis: Basically, a change of the effect w of the treatment occurs at the area 6a opposite of the openings, may such be a change of the rate of the etching or sputtering, respectively or of the rate of the coating, and specifically substantially only within this area and not at the adjacent areas of the surface 6.

Figure 2:
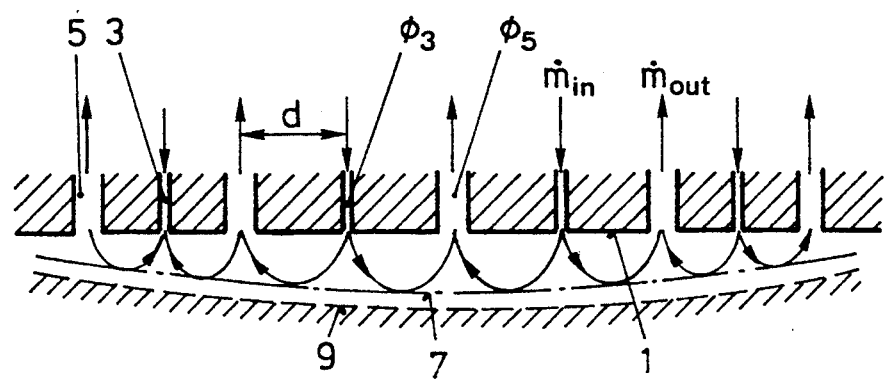
FIG. 2 is an illustration similar to FIG. 1, with infeed openings and draw off openings arranged at differing distances and the reaction space volume area resulting therefrom and utilized in accordance with the invention.

According to FIG. 2 now, a distribution of the effect of the treatment can be changed by varying the distance d between the pairs of openings at the here planar surface 1, or by a varying of the infeed conditions, of the draw off conditions, such as the feed rate of the infeed, and the feed rate of the drawing off.

FIG. 2 illustrates a variant of the distance d between the openings. A surface 7 is indicated by a dash-dotted line on a qualitative basis on which surface 7 at least approximately the same local effects of the treatment occur. By a purposeful or intentional, respectively variation of the local distances d between the pairs and/or such as mentioned, by varying of the diameter $\phi_3$ of the infeed openings or the diameter $\phi_5$ of the draw off openings, respectively or of the infed mass of gas $m_{in}$ per unit of time of the drawn off mass of gas $m_{out}$ per unit of time, respectively it is possible to produce in the volume portion $V_p$ utilized in accordance with the invention a desired distribution of the effect or, correspondingly, to arrange a surface of a workpiece to be treated in accordance with a desired distribution of the effect of the treatment at its surface in mentioned volume portion $V_p$ such as indicated at 9.

FIGS. 3(a)–(d) illustrate as examples four possible arrangements of infeed openings 3 and draw off openings 5, respectively. According to FIG. 3(a) a plurality of draw off openings 5 are allocated to one respective infeed opening 3 which openings 5 are located with their centers lying on a circle which is concentric relative to the infeed opening 3. These openings form relative to the dash-dotted area 6a infeed and draw off openings which cooperate with each other in accordance with the invention.

Figure 3A:
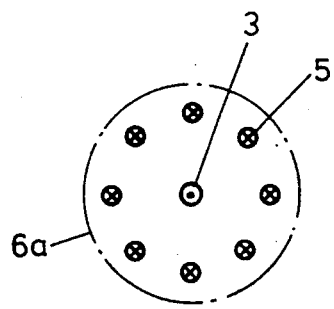
FIGS. 3a, 3b, 3c, 3d illustrate four exemplary arrays of openings of an arrangement in accordance with the invention.
Figure 3B:
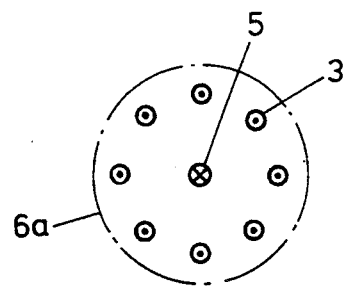

The conditions of FIG. 3(b) are changed around; a plurality of infeed openings 3 are allocated to one central draw off opening 5 which openings 3 are located with their centers lying on a concentric circle, which openings influence in accordance with the invention together the effect of the treatment at the area 6a of the surface.

Figure 3C:
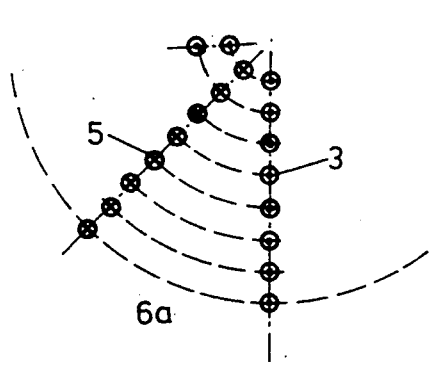

FIG. 3(c) illustrates for instance for a surface treatment of circular substrates a cut-out of an array of openings which is formed in radially arranged rows of infeed openings 3 and the thereto allocated draw off openings 5, respectively. The shape of the flow extends accordingly substantially in a azimuthal direction such as shown by broken curved lines; two respective adjacent rows of openings act substantially onto a sector shaped area 6a.

Figure 3D:
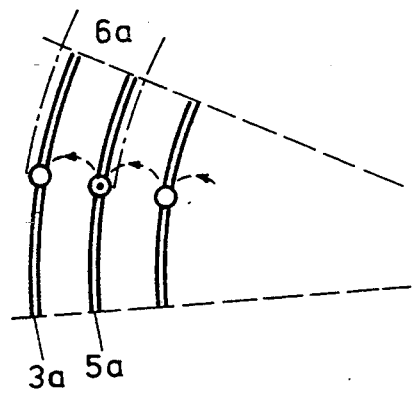

FIG. 3(d) illustrates, also as example, an array for the surface treatment of circular substrates having instead of single hole openings infeed slots 3a and draw off slots 5a, resp. which are arranged in an azimuthal orientation by means of which a substantially radial flow state is produced and whereby adjacent openings 3a and 5a, respectively act onto ring shaped surface areas 6a.

Due to the procedure according to the invention by means of which flows are brought to effectively act at the surface to be treated which are caused by the infeed opening and the draw off opening, it is possible to produce by a purposeful and aimed structuring of their pictures or fields, respectively of flow definitely set distributions of coating effects such as the distribution of etching rates or sputtering rates or coating rates at the surface of the workpiece to be treated.

Figure 4:
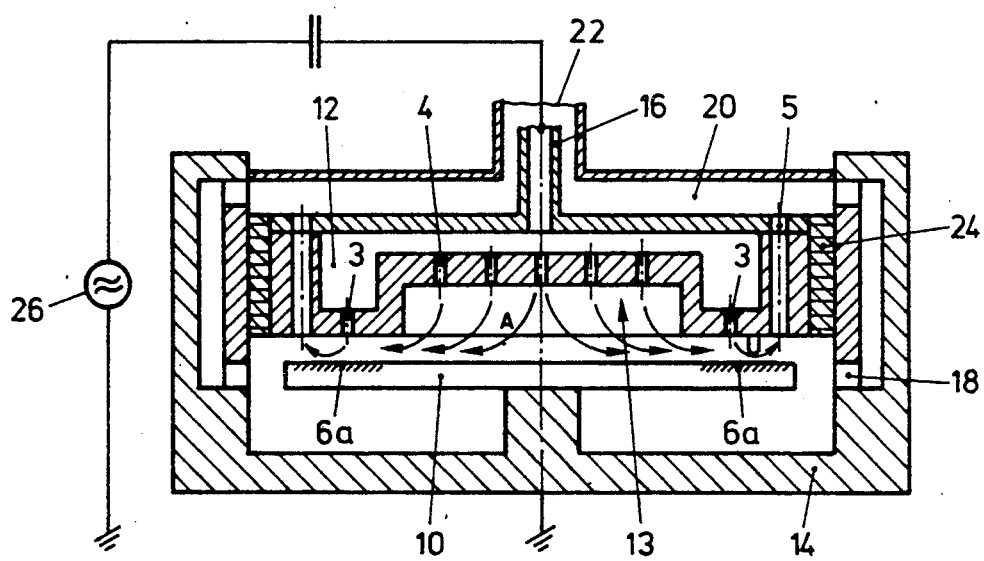
FIG. 4 is a schematic longitudinal section through a vacuum treatment chamber designed as plasma-CVD-chamber, including arrays of infeed and draw off openings structured in accordance with the present invention, and a support for a workpiece.

FIG. 4 illustrates schematically the longitudinal section through a vacuum treatment chamber structured in accordance with the present invention. This chamber is as an example a plasma-CVD-surface treatment chamber including an RF-plasma generation. In this arrangement the inventive procedure is utilized in a closely defined area of the volume of the reaction.

Such as for instance disclosed in the European specification EP-A-O 322 466 for plasma CVD treatment gas with reaction gas A is fed out of an array 13 of substantially equally distributed similar infeed openings 4 from a treatment gas distribution chamber 12 to a thereto oppositely located substrate 10. Gas is led to the distribution chamber 12 via a conduit 16.

Figure 5:
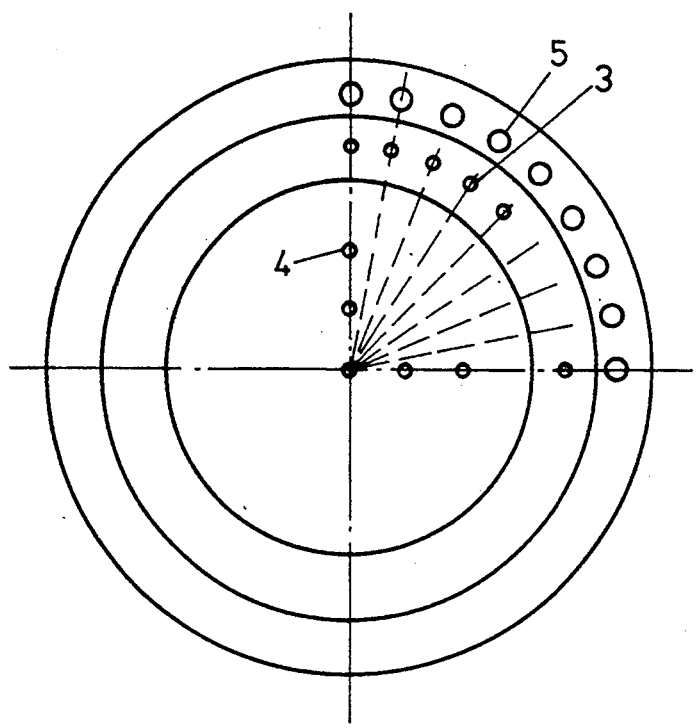
FIG. 5 is a schematic top view of an infeed/draw off opening plate, such as foreseen at the array according to FIG. 4.

For instance, such as illustrated in FIG. 5, pairs of infeed openings 3 and draw off openings 5 are located in the peripheral area relative to the substrate 10 and are in accordance with the present invention located at a selected distance relative to the surface of the substrate 10.

It corresponds to the arrangement of the pairs of openings 3, 5 of the present invention, whereas the gas jet infeed openings 4 at the centre area and the draw off openings 18 located at the peripheral area of the treatment chamber 14 corresponds to the prior art.

The draw off openings 5 arranged in accordance with the invention and the peripheral draw off openings 18 arranged in accordance with the prior art communicate with a gas collection chamber 20 which is connected to a draw off conduit 22. The infeed openings 4 according to the prior art and the infeed openings 3 provided in accordance with the present invention communicate in turn with the gas distribution chamber 12. The array with the infeed openings 3 and 4 and of the draw off openings 5 is electrically insulated relative to the wall of the chamber 14 such as schematically illustrated at 24 and is operated in the specific case under consideration by a RF or HF, respectively generator 26. The substrate 10 and the wall of the chamber 14 are for instance connected to earth potential. However, the substrate 10 can also be biassed by a DC-potential.

As now can be seen the distance between the surface of the substrate at the central area and the infeed jet openings 4 is considerably larger than the distance between same at the peripheral area and the pairs of openings 3, 5. Whereas in the first named area a not controllable, substantially radially outwards decreasing distribution of the rate of the fed-in fresh reaction gas and gaseous reaction products at the surface of the substrate is produced due to the there large distance within the plasma space between the array of infeed and draw off openings formed by the RF-electrode and the grounded substrate, this rate becomes in the peripheral area equipped in accordance with the invention due to the realized distances between the infeed and draw off opening pairs relative to the distance from the surface of the substrate controllable. There, the surface of the substrate is in accordance with the invention located only at such a distance from the pairs of openings 3, 5 that the local U-flow generated by the openings 3, 5 wafts over the area 6a located there.

By means of this arrangement the mentioned rate can be influenced in accordance with the invention in the space utilized there which is considerably less deep than at the central area.

FIG. 5 illustrates schematically a top view of the array and arrangement of the infeed openings 4 and the pairs of openings 3, 5 which are foreseen in accordance with the invention at the treatment chamber according to FIG. 4.

Figure 6:
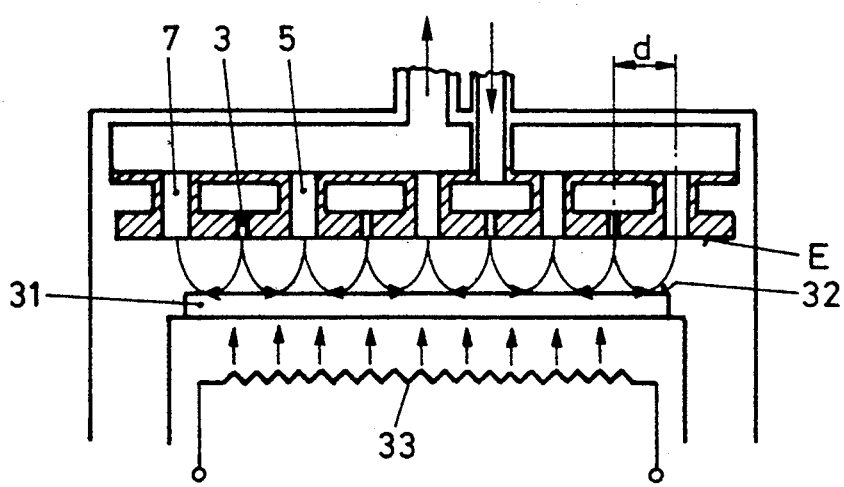
FIG. 6 illustrates an array illustrated analogous to the array of FIG. 4, for a pyrolytic CVD-coating of a work piece.

FIG. 6 shows, in an illustration analogous to that of FIG. 4, a treatment chamber for a surface reaction process, specifically an inventive chamber for a pyrolytic CVD-coating. The process can be performed depending from the demands of the process at atmospheric pressure conditions or at vacuum conditions.

A substrate 31 to be coated rests on a heated support surface which, such as indicated schematically, is heated for instance by a electric heating device 33 for a conducting of the reaction energy onto the substrate surface 32. Oppositely of the surface 32 of the substrate 31 to be coated an arrangement of distributed infeed openings 3 and draw off openings 5 is forseen whereby in this illustrated example the distances d between adjacent infeed and draw off openings 3, 5 are the same.

The substrate 31 is held at a plane equidistant from an infeed opening end and draw off opening end plane E of the openings 3, 5, and specifically relative to the plane E at a distance which meets the inventive demands relative to the area selective changes due to changes of the conditions of the infeed and/or the drawing off.

Figure 7A:
FIG. 7a illustrates flow conditions arrived at with the array according to FIG. 6, illustrated qualitatively.

As illustrated further in FIG. 7a a treatment gas feeding and reaction gas drawing off state is arrived at locally at the surface of the substrate 31 which can be influenced purposefully or aimed, respectively by the arrangement of the pairs of the openings and, specifically, can be formed homogeneous over and across the surface and such also in case of very widespread surfaces of substrates.

Figure 7B:
FIG. 7b illustrates an unsuitable gas flow along and across the surface of the workpiece, such as to be avoided according to the invention.

In accordance with the illustration of FIG. 7b such a influencing can then no longer be made locally when the treatment gas which is fed flows over longer surface areas of the substrate and is increasingly consumed.

Furthermore, due to the utilizing of the flow in accordance with the present invention a substantial increase of the efficiency relative to the infed amount of treatment gas is attained: Practically the entire amount of treatment gas fed into the reaction chamber or space, respectively reaches the direct area of the hot surface of the substrate and reacts there, whereagainst, according to FIG. 7b the amount or mass, respectively of the gas which reacts at said area remains the longer the more consumed at its surface.

Figure 8:
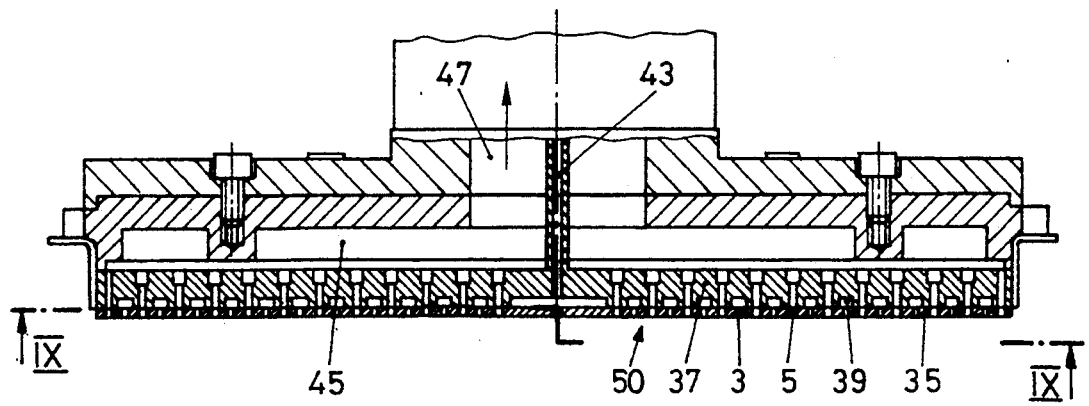
FIG. 8 is a sectional illustration of a preferred variant of an embodiment of an infeed/draw off opening array, to which may such be additionally connected as electrode, such as for a plasma etching or CVD process, or operated electrically neutral, such as for a pyrolytic CVD-process.
Figure 9:
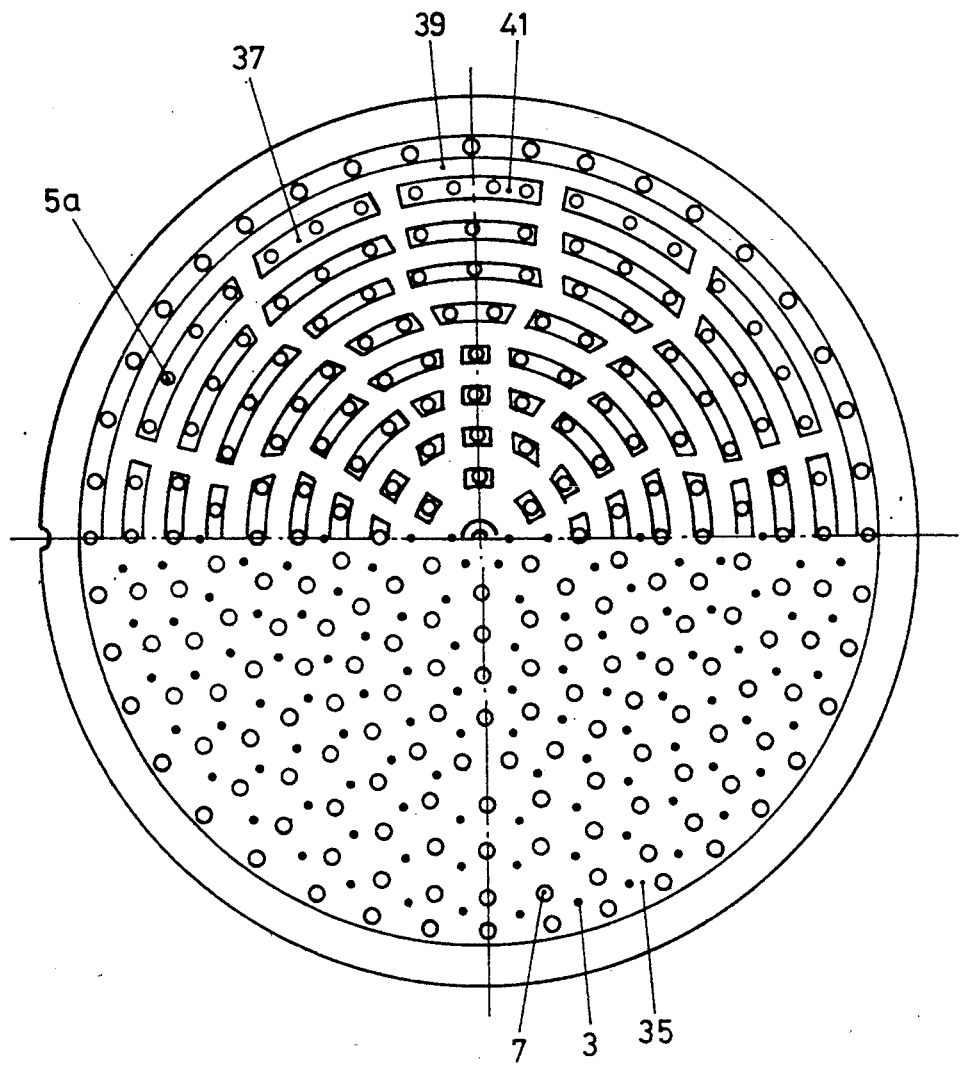
FIG. 9 is a section along line VI—VI through the plate according to FIG. 6.

FIGS. 8 and 9 illustrate a preferred variant of a realization of the gas infeed and gas draw off openings.

The arrangement with the infeed and draw off openings 3, 5 includes an outer plate 35 having in accordance with FIG. 9 infeed openings 3 having a small diameter and draw off openings 5 having a larger diameter. The infeed openings 3 communicate with a groove 39 worked into a plate 37 which extends in concentric, radially connected circles over the plane of the plate 37 or, for instance, can also be formed in a meander-like shape.

The areas 41 of the plate 37 which are not subjected to the groove 39 abut the outer plate 35 in a sealed manner. The draw off openings 5 are worked into these areas 41 in form of bores 5a. From a central conduit 43 fresh treatment gas is led into the distribution chamber formed by the groove 39. The bores 5a communicate in turn with a gas collection chamber 45 which is connected via a conduit 47 to a drawing off source in accordance with known techniques.

It is quite obvious that the grooves 39 can also be worked into the outer plate 35.

Due to the fact that the distribution chamber is formed in the shape of a groove 39 a simple possibility is produced to realize the arrangement of the pairs of openings located at distances in accordance with the invention. In a chamber the one arrangement of openings according to FIGS. 8 and 9 can be easily replaced by a different one, depending from the desired flow conditions to be utilized at the treatment of a workpiece.

Quite obviously the entire arrangement such as illustrated in FIGS. 8 and 9 can in case of the application in a plasma vacuum treatment process be connected electrically to a potential or as electrically grounded electrode work against a workpiece switched to a predetermined potential.

While there are shown and described present preferred embodiments of the invention, it is to be distinctly understood that the invention is not limited thereto, but may be otherwise variously embodied and practiced with the scope of the following claims.

I claim:

1. A method for treating a surface by reactive process, comprising the steps of:
   (a) providing several gas inlet openings into a reactor vessel;
   (b) providing several gas retrieving openings from said reactor vessel;
      said gas inlet and gas retrieving openings being arranged neighboring each other and distributed along a surface opposite said surface to be treated, said openings each having central axes directed substantially perpendicular to said surface to be treated, each gas inlet opening being associated with a gas retrieving opening to define a pair of openings;
   (c) feeding a gas mixture having a reactive gas to said gas inlet openings for injecting said gas towards said surface to be treated;
   (d) withdrawing gas having reaction products resulting from a reactive treatment of said surface to be treated out of said reactor vessel through said gas retrieving openings;
   (e) controlling an effect of a treatment on an area being treated by a given pair of openings by adjusting one of a group of variables, said variables including: selecting, as a first variable, a distance between a gas inlet opening and a gas retrieving opening forming an opening pair, and selecting, as a second variable, a distance of said opening pair to an area of said surface to be treated opposite said pair, and selecting as a third and a fourth variable, a gas injecting rate and a gas withdrawing rate, respectively, whereby an adjustment of at least one of said variables results in a variation of a treatment effect by reactive process of the surface being treated at said area, which variation is larger than variations of a treatment effect of a surface being treated occurring at surface areas adjacent said area disposed opposite said given pair of openings which variations result from said adjustment.

2. The method of claim 1 further comprising the step of controlling a distribution of a reactive treatment along said surface by adjusting said at least one of the third and fourth variables at a plurality of distributed opening pairs.

3. The method of claim 1 wherein said reactive treatment is a chemical vapor deposition (CVD) treatment.

4. The method of claim 3 wherein said CVD treatment is a pyrolytic CVD treatment process.

5. The method of claim 1 further comprising evacuating said receptacle and generating a plasma discharge therein preparatory to performing step (a).

6. The method of claim 5 whereby the step of generating a plasma discharge includes generating a DC plasma discharge.

7. The method of claim 5 whereby the step of generating a plasma discharge includes generating an AC plasma discharge.

8. The method of claim 1 further comprising evacuating said reactor vessel and generating therein a plasma discharge and thereafter applying a DC bias voltage to a workpiece to be treated preparatory to performing step (a).

9. The method of claim 1 wherein the step of treating a workpiece further comprises treating said workpiece by a reactive PVD process.

10. The method of claim 2 wherein an adjustment is made of at least one of said variables for at least one of said opening pairs which is different than adjustment of the variables of at least another one of said pairs of openings to provide different treatment effects at the area associated with said other one of said pairs of openings.

11. The method of claim 10 wherein the adjustment of at least one of said variables for the opening pairs further includes adjustment of at least one of said variables to compensate for a particular localized treatment condition along a surface of a workpiece being treated.

12. The method of claim 1 wherein adjustment of the variable of selecting separation distance between an opening pair further comprises selecting a separation distance such that a gas inlet opening and gas retrieving opening of each opening pair is less than a distance between the gas inlet opening and an opening of any other opening pair and is less than a distance between the gas retrieving opening and an opening of any other opening pair.

13. The method of claim 1 wherein step (a) further comprises forming an elongated gas inlet opening to define a curvature and wherein step (b) further comprises the step of providing an elongated gas retrieving opening similar to said elongated gas inlet opening, said elongated openings forming an opening pair to treat a curved surface area along a surface of a workpiece being treated.

14. The method of claim 1 wherein step (e) further comprises positioning a surface of a workpiece to be treated so that a distance between an area of the surface to be treated and the surface containing a pair of said gas inlet and said gas retrieving openings for treating said area is no greater than twice a distance between the pair of gas inlet and gas retrievable openings treating said area.

* * * * *